United States Patent [19]
Sakairi

[11] Patent Number: 6,140,890
[45] Date of Patent: Oct. 31, 2000

[54] SAW FILTER WITH MULTIPLE REFLECTOR PAIRS

[75] Inventor: Natsuhiko Sakairi, Tokyo, Japan

[73] Assignee: NEC Corporation, Tokyo, Japan

[21] Appl. No.: 09/188,935

[22] Filed: Nov. 10, 1998

[30] Foreign Application Priority Data

Nov. 12, 1997 [JP] Japan ................... 9-310221

[51] Int. Cl.⁷ .................................. H03H 9/64
[52] U.S. Cl. ............... 333/195; 333/194; 310/313 D
[58] Field of Search ................... 333/193–196; 310/313 R, 313 B, 313 D

[56] References Cited

U.S. PATENT DOCUMENTS

| Re. 33,957 | 6/1992 | Nakazawa et al. | 333/195 |
|---|---|---|---|
| 4,072,915 | 2/1978 | Mitchell | 333/194 |
| 4,370,633 | 1/1983 | Schofield | 333/195 |
| 4,463,327 | 7/1984 | Suzuki et al. | 333/194 |
| 4,490,698 | 12/1984 | Morimoto | 333/193 |
| 4,513,261 | 4/1985 | Yen et al. | 333/194 |
| 4,542,356 | 9/1985 | Nakazawa et al. | 333/195 |
| 4,635,008 | 1/1987 | Solie | 333/195 |
| 4,672,338 | 6/1987 | Faber | 333/194 |
| 4,679,014 | 7/1987 | Bulst et al. | 333/195 |
| 4,703,290 | 10/1987 | Zibis et al. | 333/195 |
| 5,365,138 | 11/1994 | Saw et al. | 310/313 B X |
| 5,592,040 | 1/1997 | Yamamoto | 333/195 X |
| 5,600,287 | 2/1997 | Kwan et al. | 333/195 |
| 5,760,664 | 6/1998 | Allen | 333/195 X |
| 5,896,072 | 4/1999 | Bergmann et al. | 333/195 |

FOREIGN PATENT DOCUMENTS

| 56-122217 | 9/1981 | Japan | 333/195 |
|---|---|---|---|
| 58-223912 | 12/1983 | Japan | 333/195 |
| 61-208306 | 9/1986 | Japan | 333/195 |
| 62-199111 | 9/1987 | Japan | 333/195 |
| 63-92123 | 4/1988 | Japan . | |
| 63-285018 | 11/1988 | Japan . | |
| 64-23611 | 1/1989 | Japan . | |
| 1-236809 | 9/1989 | Japan . | |
| 1-321714 | 12/1989 | Japan | 333/195 |
| 2-213212 | 8/1990 | Japan | 333/195 |
| 4-249907 | 9/1992 | Japan . | |
| 4-506443 | 11/1992 | Japan . | |
| 5-251986 | 9/1993 | Japan . | |
| 5-251987 | 9/1993 | Japan . | |
| 6-152317 | 5/1994 | Japan . | |
| 7-183760 | 7/1995 | Japan . | |
| 7-254835 | 10/1995 | Japan . | |
| 8-51334 | 2/1996 | Japan . | |

OTHER PUBLICATIONS

Japanese Office Action issued Feb. 24, 2000 in a related application with English translation of relevant portions.

*Primary Examiner*—Robert Pascal
*Assistant Examiner*—Barbara Summons
*Attorney, Agent, or Firm*—Ostrolenk, Faber, Gerb & Soffen, LLP

[57] ABSTRACT

A SAW filter, comprising a piezoelectric substrate and a first interdigital electrode having a period of L and disposed on the piezoelectric substrate. The filter converts an input voltage into a surface acoustic wave on the piezoelectric substrate. A second interdigital electrode having the period of L is disposed on the piezoelectric substrate in parallel with the first interdigital electrode with respect to a propagating direction of the surface acoustic wave. The second interdigital electrode converts the surface acoustic wave on the piezoelectric substrate into a voltage. A pair of first reflectors having a period of L/2 are disposed on the piezoelectric substrate and beside both sides of a pair of the first and second interdigital electrodes in the propagating direction keeping a distance of nL/2+0.5 L therefrom, where n is an integer equal to or larger than zero. At least a second reflector having the period of L/2 is disposed on the piezoelectric substrate and beside an outer side of one of the first reflectors in the propagating direction keeping a distance mL/2+0.75 L therefrom, where m is an integer equal to or larger than zero.

21 Claims, 5 Drawing Sheets

SAW FILTER WITH MULTIPLE REFLECTOR PAIRS

BACKGROUND OF THE INVENTION

1. Field of the Invention

The present invention relates to an SAW (Surface Acoustic Wave) filter and in particular, to a resonator type SAW filter.

2. Description of the Prior Art

A SAW filter has been generally used as a high band pass filter. Since the SAW filter is structured in a smaller size than an LC filter, the SAW filter has been used in many portable electronic apparatuses such as portable telephone units.

As a first prior art reference, JPA-63-92123 discloses some SAW filters as shown in the accompanying FIG. 6 thereof which are composed of four resonance elements of which each comprises a pair of interdigital electrodes and reflectors that are disposed beside both sides of the pair of interdigital electrodes and reflect a surface wave excited by one of the interdigital electrodes. The resonance element is shown in FIG. 1 thereof. Because the combinations of resonance elements are suitably selected, the SAWs of the first reference has filter characteristics which cannot be obtained by each of the resonance elements.

As a second prior art reference, JPA-5-251987 discloses some internally impedance-matched acoustic surface wave filters which are shown in the accompanying FIGS. 1 and 3. The filters of the second reference also comprise four resonance elements and have advantages of small insertion loss and small attenuation.

As a third prior art reference, JPA-7-254835 discloses a longitudinal mode type filter which comprises two reflectors and a pair of interdigital electrodes disposed between the reflectors as shown in the accompanying FIG. 1. A surface wave excited by the input electrode is enclosed between the reflectors and effectively received by the output electrode. Thus, the loss of the filter is small.

In FIG. 8 of JPA-63-92123 as the first reference, a combinatorial filter making use of a longitudinal mode resonance is disclosed.

Although the filters of the prior art references have the above-explained advantages, the filters have disadvantages of strong spurious response and small out-band attenuation. On the other hand, a transversal mode coupled type resonance filter has advantages of weak spurious response and large out-band attenuation. Therefore, the transversal mode coupled type resonance filter has been widely used. As shown in FIG. 7, the transversal mode coupled type resonance filter has a first resonator which is the upper half portion of FIG. 7 and a second resonator which is the lower half portion of FIG. 7. The first resonator has interdigital electrode 16 and reflectors 18 and 19 disposed beside both sides of interdigital electrode 16. Reflectors 18 and 19 reflect a surface wave excited by interdigital electrode 16. The second resonator has the same structure as the first resonator including interdigital electrode 17. The first and second resonators are adjacently disposed in parallel so that their propagating direction of a surface wave become identical. An input ground electrode and an output ground electrode are structured in common as common bus bar 20. Since the two resonators are adjacently disposed, surface waves enclosed between the reflectors of the resonators have a symmetrical resonance mode and an asymmetrical mode. In the symmetrical resonance mode, the energy distribution perpendicular to the propagating direction of the surface wave is symmetrical. In the asymmetrical resonance mode, the energy distribution perpendicular to the propagating direction of the surface wave is asymmetrical. The two modes are referred to as transversal modes. When an interdigitated width of the interdigital electrodes and a thickness of thin film of the interdigital electrodes are properly selected, symmetrical mode S0 or asymmetrical mode A1 can be selectively excited as shown in FIG. 3. FIG. 8 shows an example of a frequency characteristic of such a filter. In FIG. 8, a dashed line represents a curve measured with a 50-ohm system, whereas a solid line represents a curve in a impedance-matched state. As shown in FIG. 8, the mode S0 is present at a lower frequency than the mode A1. When this filter is used in an impedance-matched state, a filter characteristic with a flat band as represented by the solid line can be obtained.

As explained above, a bandwidth of this filter depends on the difference between the two resonance frequencies. The difference between the two resonance frequencies depends on distance G between the two resonators and interdigitated width W of each resonator. In order to widen the bandwidth, distance G and the interdigitated width W should be decreased. However, when the interdigitated width W of the resonators is decreased, the impedance of the filter is increased. Thus, the usefulness of the filter deteriorates. In order to decrease distance G between the resonators, it is necessary to decrease a width of common bus bar 20. Thus, a resistance of bus bar 20 increases, whereby the insertion loss characteristic of the filter deteriorates, and moreover, the frequency characteristic of the entire filter occasionally and remarkably deteriorates. Consequently, it was difficult to widen the bandwidth of the conventional transversal mode coupled type filter.

SUMMARY OF THE INVENTION

An object of the present invention is to provide a multiple mode SAW filter that allows the bandwidth thereof to be widened without the need to decrease the interdigitated width of each resonator and the distance between the resonators.

According to a first aspect of the present invention, there is provided an SAW filter, which comprises: a piezoelectric substrate; a first interdigital electrode having period L and disposed on the piezoelectric substrate, for converting an input voltage into a surface acoustic wave on the piezoelectric substrate; a second interdigital electrode having the period L and disposed on the piezoelectric substrate in parallel with the first interdigital electrode with respect to a propagating direction of the surface acoustic wave, for converting the surface acoustic wave on the piezoelectric substrate into a voltage; a pair of first reflectors having period L/2 and disposed on the piezoelectric substrate beside both sides of a pair of the first and second interdigital electrodes in the propagating direction keeping distance nL/2+0.5 L therefrom, where n is an integer equal to or larger than zero; and at least a second reflector having the period L/2 and disposed on the piezoelectric substrate beside an outer side of one of the first reflectors in the propagating direction keeping distance mL/2+0.75 L therefrom, where m is an integer equal to or larger than zero. According to a second aspect of the present invention, there is provided an SAW filter, which comprises: a piezoelectric substrate; a first interdigital electrode having period L and disposed on the piezoelectric substrate, for converting an input voltage into a surface acoustic wave on the piezoelectric substrate; a second interdigital electrode having the period L and disposed on the piezoelectric substrate in parallel with the first interdigital electrode with respect to a propagating direction of the surface acoustic wave, for converting the surface acoustic wave on the piezoelectric substrate into a voltage; a pair of first reflectors disposed on the piezoelectric substrate and outside a pair of the first and second interdigital electrodes in the propagating direction; and at least a second reflector disposed between the pair of the first and second interdigital electrodes and one of the first reflectors.

These and other objects, features and advantages of the present invention will become more apparent in light of the following detailed description of the best mode of embodiment thereof, as illustrated in the accompanying drawings.

DESCRIPTION OF PREFERRED EMBODIMENTS

[First Embodiment]

Next, with reference to the accompanying drawings, a first embodiment of the present invention will be explained.

Figure 1:
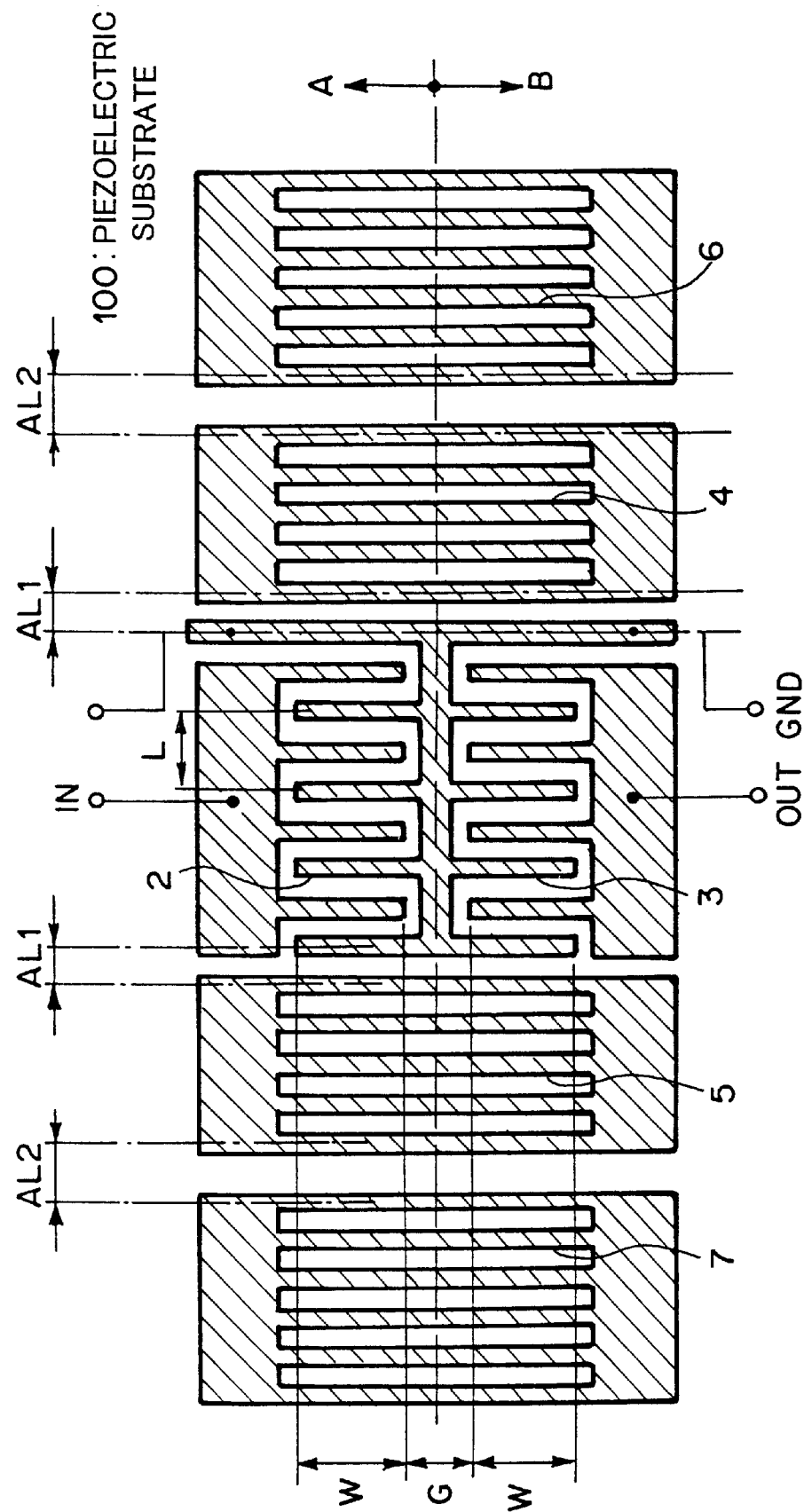
FIG. 1 is a schematic diagram showing the structure of an SAW filter according to a first embodiment of the present invention.

FIG. 1 is a schematic diagram showing the structure of an SAW filter according to the first embodiment of the present invention. The SAW filter has resonator A (i.e. the portion above a horizontal dashed line of FIG. 1) and resonator B (i.e. lower portion below the horizontal dashed line of FIG. 1) that are disposed on piezoelectric substrate 100. Resonator A has interdigital electrode 2, reflectors 4 and 5, and reflectors 6 and 7. Reflectors 4 and 5 are spaced apart from interdigital electrode 2 by a distance of AL1=0.5 L measured at the center of the finger electrodes, where L is the interval of two adjacent fingers. Reflectors 6 and 7 are spaced apart from reflectors 4 and 5 by a distance of AL2=0.75 L measured at the center of electrodes, respectively. The structure of resonator B is the same as the structure of resonator A. Resonators A and B are adjacently disposed in parallel so that their propagating directions are identical. Reflectors 4, 5, 6, and 7 are composed of thin film electrodes or grooves formed on piezoelectric substrate 100.

Figure 2:
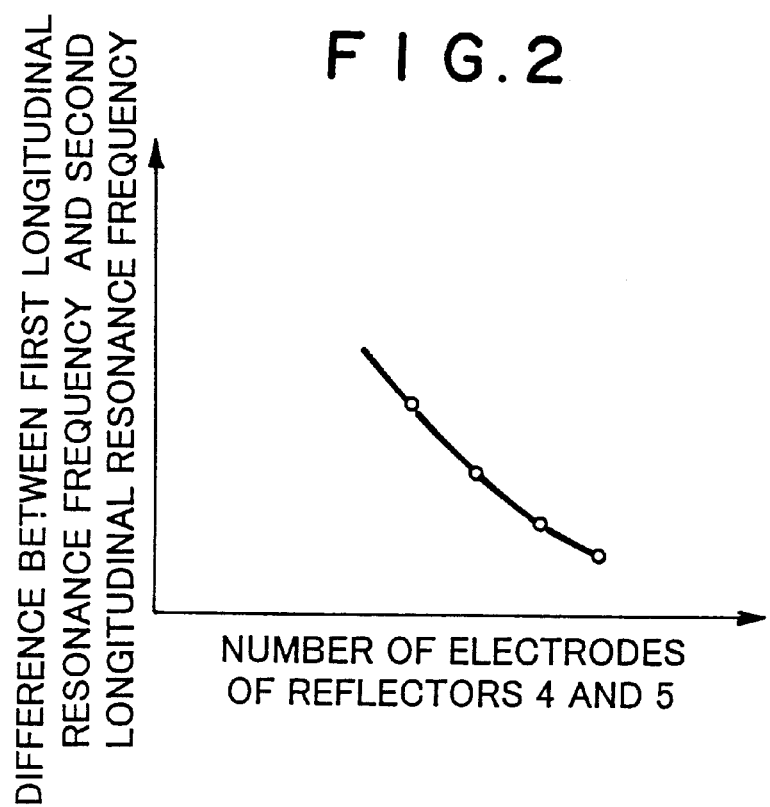
FIG. 2 is a graph showing the relation between the number of reflector elements and the difference between a first resonance frequency and a second resonance frequency.
Figure 3:
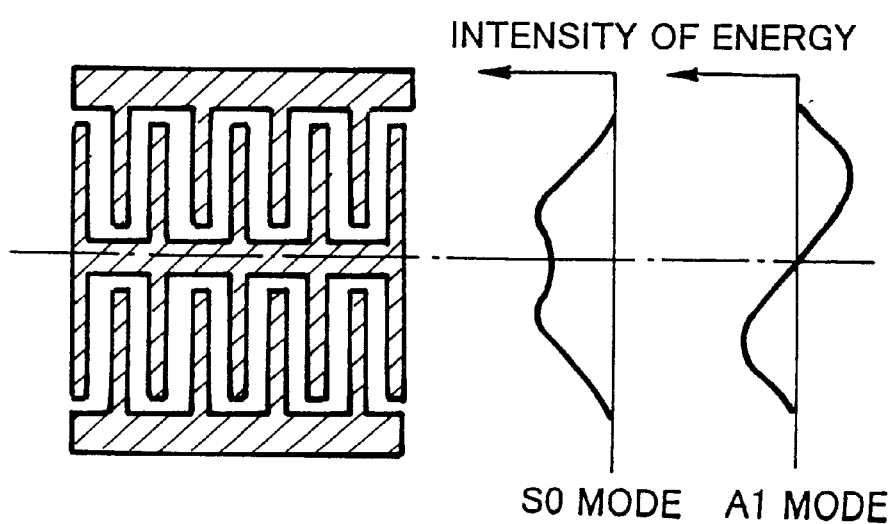
FIG. 3 is a schematic diagram showing the principle of a transversal mode resonance.

Next, the principle of operation of the present invention will be explained. A surface wave excited by interdigital electrode 2 disposed on piezoelectric substrate 100 is reflected between reflectors 4 and 5. Thus, the energy of the surface wave is enclosed, whereby a standing wave is generated. This phenomenon is hereinafter referred to as a first longitudinal resonance. On the other hand, when the number of electrodes of reflectors 4 and 5 is properly selected, a part of the energy leaks outside. The leaked waves are reflected between reflectors 6 and 7, whereby another standing wave is generated. This phenomenon is hereinafter referred to as a second longitudinal resonance. The first and second longitudinal resonances are mutually coupled. The coupling intensity depends on the number of electrodes of reflectors 4 and 5. Thus, the difference between the first and second longitudinal resonance frequencies depends on the number of the electrodes of reflectors 4 and 5. FIG. 2 is a graph showing the relation between the number of the electrodes of reflectors 4 and 5 and the difference between the first and second longitudinal resonance frequencies, wherein the number of the electrodes of reflector 4 is the same as the number of the electrodes of reflector 5. When the number of electrodes of reflectors 4 and 5 is small, the frequency difference is large because the two longitudinal resonances are strongly coupled. On the other hand, when the number of the electrodes of reflectors 4 and 5 is increased, the coupling becomes weak, whereby the frequency difference becomes small.

Resonators A and B are adjacently disposed. As explained above, the resonance excited by resonator A has two modes that are symmetrical mode S0 and asymmetrical mode A1. Each of the first and second longitudinal resonances has the symmetrical mode S0 and asymmetrical mode A1. Therefore, a total of four resonances are generated.

The intervals among four resonance frequencies can be adequately adjusted by selecting the number of the electrodes of reflectors 4 and 5, distance G between two resonators A and B, and interdigitated width W of two resonators A and B.

Figure 4:
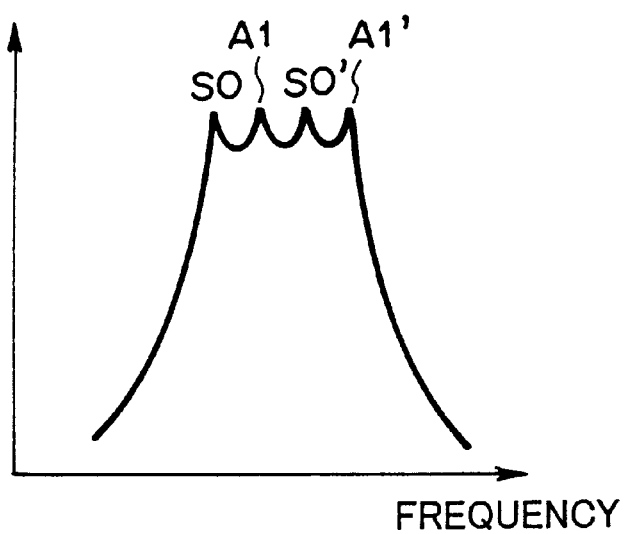
FIG. 4 is a graph showing resonance frequencies measured with a 50-ohm system of the SAW filter according to the first embodiment of the present invention.
Figure 5:
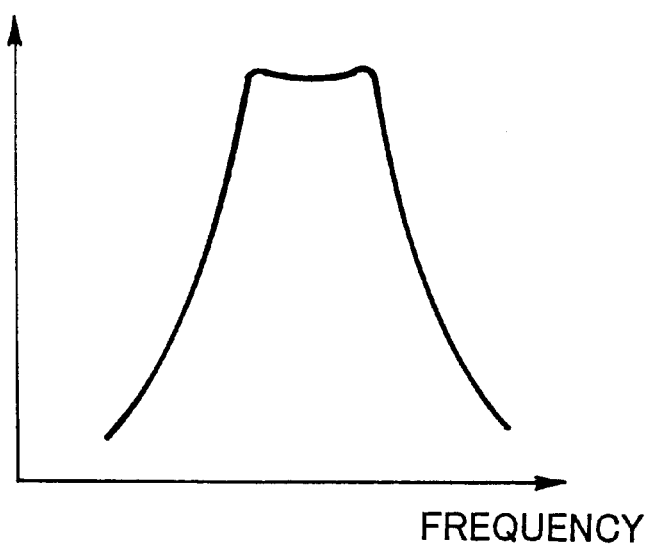
FIG. 5 is a graph showing frequency characteristics measured in an impedance-matched state of the SAW filter according to the first embodiment of the present invention.

FIG. 4 is a graph showing a filter characteristic measured with a 50-ohm system. When the filter characteristic is measured in a impedance-matched state, a flat band is obtained as shown in FIG. 5. Thus, when a filter is so formed that it uses four resonances, a wider bandwidth can be obtained than a transversal mode coupled type filter using only two transversal mode resonances.

According to the present invention, distance AL1 between the interdigital electrode and the reflector and distance AL2 between the reflectors are not limited to 0.5 L and 0.75 L, respectively. Instead, the distances AL1 and AL2 can be varied in the following ranges so as to adjust the intensities of the resonances:

AL1=nL/2+0.4 L to nL/2+0.6 L, wherein n is an integer larger than 0,

AL2=mL/2+0.65 L to mL/2+0.85 L, wherein m is an integer larger than 0.

The optimum values of AL1 and AL2 are around nL/2+0.5 L and mL/2+0.75 L, respectively, and they vary independently upon the number of electrodes of reflectors 4 and 5.

[Second Embodiment]

Figure 6:
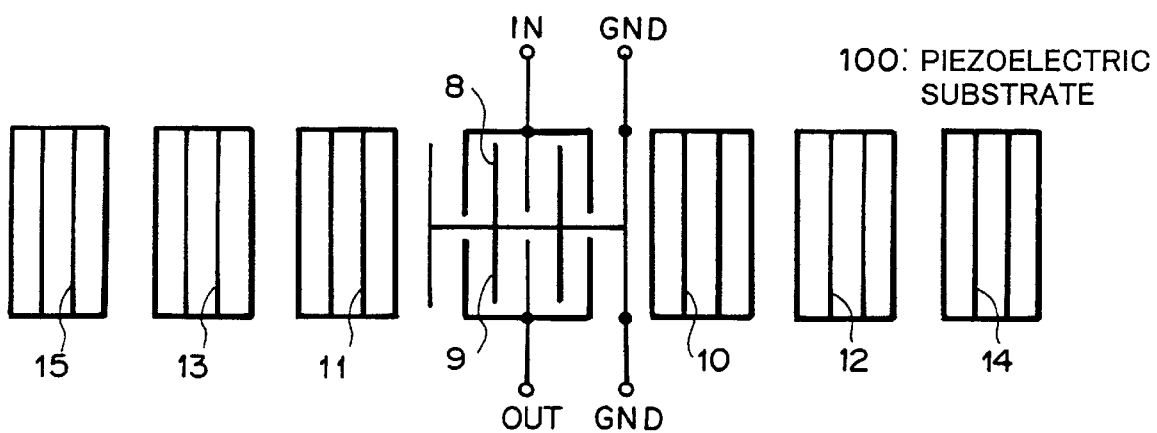
FIG. 6 is a schematic diagram showing the structure of an SAW filter according to a second embodiment of the present invention.
Figure 7:
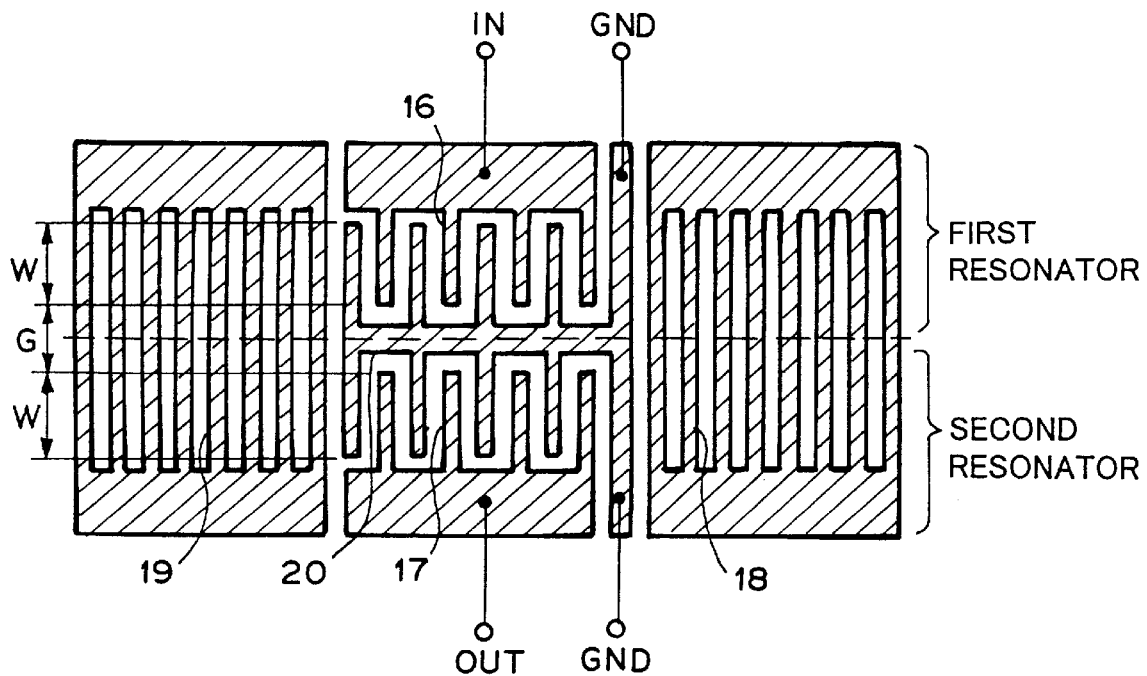
FIG. 7 is a schematic diagram showing the structure of a conventional transversal mode resonance type filter.
Figure 8:
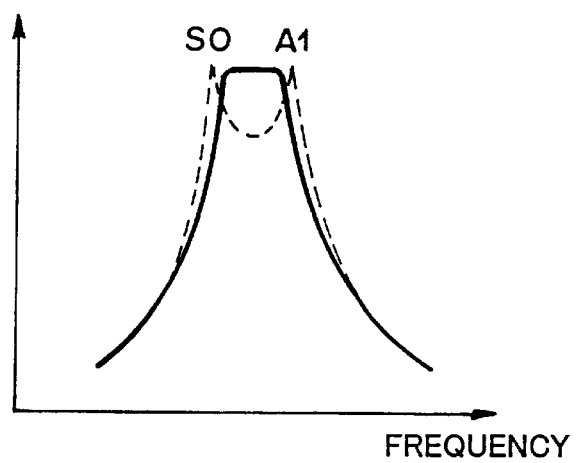
FIG. 8 is a graph showing the resonance frequency characteristics characteristics of the conventional transversal mode resonance type filter.

FIG. 6 is a schematic diagram showing the structure of an SAW filter according to a second embodiment of the present invention. The filter has interdigital electrodes 8 and 9 at the center and six, i.e. three pairs of, reflectors 10–15 beside electrodes 8 and 9. In this filter, three longitudinal resonances are generated of which each exists between reflectors 10 and 11, between reflectors 12 and 13, or between reflectors 14 and 15. Each resonance has two transversal modes that are a symmetrical mode and an asymmetrical mode, of which the energy distribution perpendicular to the propagating direction of the surface wave are symmetrical and asymmetrical, respectively. Thus, a total of six resonances are generated. Consequently, a filter with a larger bandwidth than the first embodiment can be structured. Reflectors 10–15 are composed of thin film electrodes or grooves formed on the piezoelectric substrate.

The distance between reflector 13 and reflector 15 is different from the period of reflector 15. Similarly, the distance between reflector 12 and reflector 14 is different from the period of reflector 14.

The period of the reflectors in the first embodiment and the second embodiment is equal to L/2 or different from L/2 by several percent. When the period of the reflectors is varied from L/2 by several percent, the characteristic such as insertion loss does not vary or is improved in some cases. However, when the period of the reflectors is varied from L/2 by more than several percent, the characteristics deteriorate.

Although the periods of the reflectors are preferably identical, they may be slightly different from each other. When the periods of the reflectors are different from each other to some extent, the characteristic does not deteriorate, while when they are largely different from each other, the characteristic deteriorates.

In the first and second embodiments, the reflectors are symmetrically disposed with respect to the interdigital electrodes. However, the same effects as the first and second embodiments can be obtained regardless of whether or not the number of left-side reflectors is the same as the number of right-side reflectors. Thus, according to the present invention, two reflectors and one reflector may be disposed on the left side and the right side of the interdigital electrodes, respectively. In this case, it can be regarded that one reflector is additionally inserted between one of the two outermost reflectors and the pair of interdigital electrodes. Embodiments of the present invention may be generalized so that one reflector is (or more reflectors are) inserted between one or both of the two outermost reflectors and the pair of interdigital electrodes.

As explained above, according to the present invention, since one reflector is (or more reflectors are) inserted between one or both of the two outermost reflectors and the pair of interdigital electrodes, a plurality of longitudinal resonances having transversal modes are generated, which means more resonances can be generated than the conventional filter. Therefore, a transversal mode resonance type filter having a wider bandwidth can be realized without the need to decrease the interdigitated width of resonators and the distance between the resonators, whereby such advantages of the transversal mode resonance type filter as large out-band attenuation and weak spurious response are not degraded.

Although the present invention has been shown and described with respect to the best modes of embodiment thereof, it should be understood by those skilled in the art that the foregoing and various other changes, omissions, and additions in the form and detail thereof may be made therein without departing from the spirit and scope of the present invention.

What is claimed is:

1. A surface acoustic wave filter, comprising:
a piezoelectric substrate;
a first interdigital electrode having a period of L and disposed on the piezoelectric substrate, wherein the first interdigital electrode converts an input voltage into a surface acoustic wave on the piezoelectric substrate;
a second interdigital electrode having the period of L and disposed on the piezoelectric substrate in parallel with the first interdigital electrode with respect to a propagating direction of the surface acoustic wave, wherein the second interdigital electrode converts the surface acoustic wave on the piezoelectric substrate into an output voltage;
a pair of first reflectors having a period of L/2 disposed on the piezoelectric substrate and beside both sides of a pair of the first and second interdigital electrodes in the propagating direction keeping a distance of between nL/2+0.4 L and nL/2+0.6 L therefrom, where n is an integer equal to or larger than zero; and
at least a second reflector having the period of L/2 disposed on the piezoelectric substrate beside an outer side of one of the first reflectors in the propagating direction keeping a distance greater than mL/2+0.725 L and less than or equal to mL/2+0.85 L therefrom, where m is an integer equal to or larger than zero.

2. The surface acoustic wave filter as set forth in claim 1, further comprising two second reflectors, whereby a pair of the second reflectors having the period of L/2 is disposed on the piezoelectric substrate beside outer sides of the pair of first reflectors in the propagating direction keeping the distance mL/2+0.75 L therefrom, wherein m is an integer equal to or larger than zero.

3. The surface acoustic wave filter as set forth in claim 1, wherein the distance between the pair of first and second interdigital electrodes and the pair of first reflectors is nL/2+0.5 L, wherein n is an integer equal to or larger than zero.

4. The surface acoustic wave filter as set forth in claim 1, wherein the distance between the one of the first reflectors and the second reflector is mL/2+0.75 L, wherein m is an integer equal to or larger than zero.

5. The surface acoustic wave filter as set forth in claim 1, wherein the period of the pair of first reflectors varies from L/2 by several percent or less.

6. The surface acoustic wave filter as set forth in claim 1, wherein the period of the second reflector varies from L/2 by several percent or less.

7. The surface acoustic wave filter as set forth in claim 1, wherein the first reflectors and the second reflector are comprised of thin films.

8. The surface acoustic wave filter as set forth in claim 1, wherein the first reflectors and the second reflector are comprised of grooves formed on the piezoelectric substrate.

9. The surface acoustic wave filter as set forth in claim 1, further comprising at least a third reflector having the period of L/2 and disposed on the piezoelectric substrate beside an outer side of the second reflector in the propagating direction having a distance to the second reflector being other than the period of L/2.

10. The surface acoustic wave filter as set forth in claim 9, wherein the period of the third reflector varies from L/2 by several percent or less.

11. The surface acoustic wave filter as set forth in claim 9, wherein the third reflector is comprised of a thin film.

12. The surface acoustic wave filter as set forth in claim 9, wherein the third reflector is comprised of a groove formed on the piezoelectric substrate.

13. A surface acoustic wave filter, comprising:
a piezoelectric substrate;
a first interdigital electrode having a period of L and disposed on the piezoelectric substrate, wherein the first interdigital electrode converts an input voltage into a surface acoustic wave on the piezoelectric substrate;

a second interdigital electrode having the period of L, disposed on the piezoelectric substrate in parallel with the first interdigital electrode with respect to a propagating direction of the surface acoustic wave, wherein the second interdigital electrode converts the surface acoustic wave on the piezoelectric substrate into an output voltage;

a pair of first reflectors disposed on the piezoelectric substrate and disposed on opposing sides of the first and second interdigital electrodes in the propagating direction; and at least a second reflector disposed on the piezoelectric substrate beside an outer side of one of the first reflectors in the propagating direction keeping a distance greater than $mL/2+0.725$ L and less than or equal to $mL/2+0.85$ L therefrom, where m is an integer equal to or larger than zero.

14. The surface acoustic wave filter as set forth in claim 13, wherein the reflectors are comprised of thin films.

15. The surface acoustic wave filter as set forth in claim 13, wherein the reflectors are comprised of grooves formed on the piezoelectric substrate.

16. A surface acoustic wave filter, comprising:

a piezoelectric substrate;

a first interdigital electrode having a period of L and disposed on the piezoelectric substrate, wherein the first interdigital electrode converts an input voltage into a surface acoustic wave on the piezoelectric substrate;

a second interdigital electrode having the period of L and disposed on the piezoelectric substrate in parallel with the first interdigital electrode with respect to a propagating direction of the surface acoustic wave, wherein the second interdigital electrode converts the surface acoustic wave on the piezoelectric substrate into an output voltage;

a pair of first reflectors having a period of L/2 disposed on the piezoelectric substrate and beside both sides of a pair of the first and second interdigital electrodes in the propagating direction keeping a distance of between $nL/2+0.4$ L and $nL/2+0.6$ L therefrom, where n is an integer equal to or larger than zero;

at least a second reflector having the period of L/2 disposed on the piezoelectric substrate beside an outer side of one of the first reflectors in the propagating direction keeping a distance of between $mL/2+0.65$ L to $mL/2+0.85$ L therefrom, where m is an integer equal to or larger than zero; and two second reflectors, whereby a pair of the second reflectors having the period of L/2 is disposed on the piezoelectric substrate beside outer sides of the pair of first reflectors in the propagating direction keeping the distance $mL/2+0.75$ L therefrom, wherein m is an integer equal to or larger than zero.

17. A surface acoustic wave filter, comprising:

a piezoelectric substrate;

a first interdigital electrode having a period of L and disposed on the piezoelectric substrate, wherein the first interdigital electrode converts an input voltage into a surface acoustic wave on the piezoelectric substrate;

a second interdigital electrode having the period of L and disposed on the piezoelectric substrate in parallel with the first interdigital electrode with respect to a propagating direction of the surface acoustic wave, wherein the second interdigital electrode converts the surface acoustic wave on the piezoelectric substrate into an output voltage;

a pair of first reflectors having a period of L/2 disposed on the piezoelectric substrate and beside both sides of a pair of the first and second interdigital electrodes in the propagating direction keeping a distance of between $nL/2+0.4$ L and $nL/2+0.6$ L therefrom, where n is an integer equal to or larger than zero; and at least a second reflector having the period of L/2 disposed on the piezoelectric substrate beside an outer side of one of the first reflectors in the propagating direction keeping a distance of between $mL/2+0.65$ L to $mL/2+0.85$ L therefrom, where m is an integer equal to or larger than zero;

wherein the distance between the one of the first reflectors and the second reflector is $mL/2+0.75$ L, wherein m is an integer equal to or larger than zero.

18. A surface acoustic wave filter, comprising:

a piezoelectric substrate;

a first interdigital electrode having a period of L and disposed on the piezoelectric substrate, wherein the first interdigital electrode converts an input voltage into a surface acoustic wave on the piezoelectric substrate;

a second interdigital electrode having the period of L and disposed on the piezoelectric substrate in parallel with the first interdigital electrode with respect to a propagating direction of the surface acoustic wave, wherein the second interdigital electrode converts the surface acoustic wave on the piezoelectric substrate into an output voltage;

a pair of first reflectors having a period of L/2 disposed on the piezoelectric substrate and beside both sides of a pair of the first and second interdigital electrodes in the propagating direction keeping a distance of between $nL/2+0.4$ L and $nL/2+0.6$ L therefrom, where n is an integer equal to or larger than zero;

at least a second reflector having the period of L/2 disposed on the piezoelectric substrate beside an outer side of one of the first reflectors in the propagating direction keeping a distance of between $mL/2+0.65$ L to $mL/2+0.85$ L therefrom, where m is an integer equal to or larger than zero; and further comprising at least a third reflector having the period of L/2 and disposed on the piezoelectric substrate beside an outer side of the second reflector in the propagating direction having a distance to the second reflector being other than the period of L/2.

19. The surface acoustic wave filter as set forth in claim 18, wherein the period of the third reflector varies from L/2 by several percent or less.

20. The surface acoustic wave filter as set forth in claim 18, wherein the third reflector is comprised of a thin film.

21. The surface acoustic wave filter as set forth in claim 18, wherein the third reflector is comprised of a groove formed on the piezoelectric substrate.

* * * * *